United States Patent [19]
Bantu et al.

[11] Patent Number: 5,609,989
[45] Date of Patent: Mar. 11, 1997

[54] ACID SCAVENGERS FOR USE IN CHEMICALLY AMPLIFIED PHOTORESISTS

[75] Inventors: Nageshwer R. Bantu, Hopewell Junction; William R. Brunsvold, Poughkeepsie; George J. Hefferon, Fishkill; Wu-Song Huang, Poughkeepsie; Ahmad D. Katnani, Poughkeepsie; Mahmoud M. Khojasteh, Poughkeepsie, all of N.Y.; Ratnam Sooriyakumaran, San Jose, Calif.; Dominic C. Yang, Mesa, Ariz.

[73] Assignee: International Business Machines, Corporation, Armonk, N.Y.

[21] Appl. No.: 466,568

[22] Filed: Jun. 6, 1995

[51] Int. Cl.$^6$ .................................................... G03F 7/039
[52] U.S. Cl. ............................................................. 430/270.1
[58] Field of Search ................................ 430/270, 270.1

[56] References Cited

U.S. PATENT DOCUMENTS

| | | | |
|---|---|---|---|
| 4,600,683 | 7/1986 | Greco et al. | 430/270 |
| 4,612,270 | 9/1986 | Pampalone et al. | 430/273 |
| 4,744,834 | 5/1988 | Haq | 134/38 |
| 4,963,463 | 10/1990 | Koshiba et al. | 430/191 |
| 5,210,000 | 5/1993 | Thackeray et al. | 430/165 |
| 5,252,435 | 10/1993 | Tani et al. | 430/325 |
| 5,258,257 | 11/1993 | Sinta et al. | 430/325 |
| 5,320,931 | 6/1994 | Umehara et al. | 430/270 |
| 5,352,564 | 10/1994 | Takeda et al. | 430/270 |
| 5,376,498 | 12/1994 | Kajita et al. | 430/191 |
| 5,525,453 | 6/1996 | Pryzbilla et al. | 430/270.1 |

FOREIGN PATENT DOCUMENTS

| | | |
|---|---|---|
| 0523957A1 | 1/1993 | European Pat. Off. |
| 0537524A1 | 4/1993 | European Pat. Off. |
| 0605089A2 | 7/1994 | European Pat. Off. |

OTHER PUBLICATIONS

Terrier et al, J Org Chem 1986 51, 409–411.

*Primary Examiner*—Cynthia Hamilton
*Attorney, Agent, or Firm*—Whitham, Curtis, Whitham & McGinn; Steven J. Soucar

[57] ABSTRACT

Proton sponge, berberine, and cetyltrimethyl ammonium hydroxide base compounds are used as additives to chemically amplified photoresists based on modified polyhydroxystyrene (PHS). The base additives scavenge free acids from the photoresist in order to preserve the acid labile moieties on the modified PHS polymer. The base additives are well suited to industrial processing conditions, do not react with the photoacid compounds in the photoresist composition to form byproducts which would hinder photoresist performance, and extend the shelf-life of the photoresist composition. In addition, the proton sponge and berberine base additives have a different absorption spectra than the modified PHS polymer, therefore, the quantity of base additive within the photoresist can be easily assayed and controlled.

11 Claims, No Drawings

ACID SCAVENGERS FOR USE IN CHEMICALLY AMPLIFIED PHOTORESISTS

BACKGROUND OF THE INVENTION

1. Field of the Invention

The present invention generally relates to additives used in photoresist materials and, more particularly, to the use of certain base compounds as acid scavengers in chemically amplified photoresists based on poly(hydroxy styrene).

2. Background Description

Manufacturing of semiconductor devices is dependent upon the accurate replication of computer aided design (CAD) generated patterns onto the surface of a device substrate. The replication process is typically performed using lithographic processes followed by a variety of subtractive (etch) and additive (deposition) processes. Optical lithography patterning involves projecting an image of a pattern, reduced in size, onto a photosensitive film (photoresist or resist) on the device substrate. Other techniques may also be employed whereby energy (UV or light) is projected onto the photoresist to effect relative changes (chemical or physical) between the exposed and unexposed portions of the photoresist material, such that portions of the photoresist material can be selectively removed to leave a desired photoresist pattern on the substrate surface. The photoresist is therefore a critical component in the manufacture of semiconductor devices.

Chemically amplified photoresists based on poly(hydroxy styrene) (PHS) have been used in the past in the field of substrate patterning. These types of resists include a PHS polymer which is modified on at least a portion of the polymer backbone at the sites of the phenolic hydroxy moieties with an acid labile functional group, a solvent for the modified PHS polymer, and an acid generating compound dissolved in the solvent with the modified PHS polymer. Often, the PHS polymer is modified in the solvent by performing an acid catalyzed reaction with the preformed PHS polymer using an acid labile protecting group. The acid generating compound can be added to the mixture after modification of the PHS polymer, and should be uniformly distributed within the mixture. The photoresist is deposited on a substrate, such as a wafer or chip, by spin coating or other suitable means. Subsequently, the photoresist is patterned by selective exposure of portions of the photoresist to an energy source such as a laser. The acid generating compound will be selected based on the type of energy used for patterning (e.g., E-Beam, I-line, deep-UV, etc.). Upon exposure to the light energy (radiation), the acid generating compound will produce an acid which will, in turn, cause the acid labile functional group to be removed from the backbone of the modified PHS polymer.

Chemical amplification of photoresist materials are described in detail in U.S. Pat. No. 5,252,435 to Tani et al., U.S. Pat. No. 5,258,257 to Sinta et al., U.S. Pat. No. 5,352,564 to Takeda et al., and U.S. Pat. No. 5,210,000 to Thackeray et al., all of which are herein incorporated by reference.

SUMMARY OF THE INVENTION

It is an object of this invention to provide improved chemically amplified photoresist compositions which include new and useful base additives that serve as acid scavengers in the photoresist composition.

It is another object of this invention to use berberine, cetyltrimethyl ammonium hydroxide, and proton sponge in a chemically amplified photoresist composition.

It is yet another object of this invention to improve the shelf-life of chemically amplified photoresist compositions by using berberine, cetyltrimethyl ammonium hydroxide, and proton sponge as base additives within the photoresist compositions.

According to the invention, berberine, cetyltrimethyl ammonium hydroxide, and proton sponge have been found to be excellent base additives for use in chemically amplified photoresist compositions. These base additives will serve the function of absorbing free acids in the photoresist composition, thereby extending the shelf-life of the photoresist. Because these base compounds are solids at room temperature, they are easy to handle in an industrial setting. They are not very nucleophilic; therefore, they do not produce undesired byproducts from reactions with the photoacid generator compounds or the like. In addition, both proton sponge and berberine have been found to have completely different absorption spectra than the modified PHS polymer; therefore, the quantity of proton sponge or berberine in the mixture can be quickly and accurately assayed.

DETAILED DESCRIPTION OF A PREFERRED EMBODIMENT OF THE INVENTION

Three base compounds have been found to be useful additives in chemically amplified photoresists based on PHS. These bases are berberine, cetyltrimethyl ammonium hydroxide and proton sponge. All of these bases are available from the Aldrich Chemical Company, among other sources. The bases are solids at room temperature, and are easy to add, store, and combine with photoresist compositions on an industrial scale. The bases will improve the shelf-life of chemically amplified photoresists, and, due to their low nucleophilic nature, will not result in the production of byproducts which will deteriorate the quality of the photoresist material.

Berberine is identified in the Merck Index as 5,6-dihydro-9,10-dimethoxybenzo[g]-1,3-benzodioxolo[5,6-a]quinilizinium. Berberine has been used internally as an antimalarial, febrifuge, and carminative, and externally as a dressing for indolent ulcers. It exists as yellow needles from ether with a melting point 145° C. It is available from Aldrich Chemical Company as acetone adduct. Lithographic performance with chemically amplified photoresists containing berberine are comparable to the performance achieved with TBAH as an additive.

Cetyltrimethyl ammonium hydroxide is available from Aldrich Chemical Company in hydrate form, where the water content is approximately 20%. Lithographic performance with chemically amplified photoresists containing cetyltrimethyl ammonium hydroxide are comparable to the performance achieved with TBAH as an additive.

The proton sponge is also known as 1,8-bis(dimethylamio)naphthalene or N,N,N',N'-tetramethyl-1,8-naphthalenediamine. Proton sponge is an organic strong base with a weaker nucleophilicity. As its name indicates, proton sponge traps the acidic proton efficiently between twin electron-rich nitrogen atoms. It is commercially available as a fine crystalline white solid with a reported melting point of 49°–51° C. and flash point of greater than 230° F. (as listed in the Aldrich Chemical Company catalog).

The beberine, cetyltrimethyl ammonium hydroxide, and proton sponge base compounds will have utility in chemically amplified photoresists based on PHS, where the modified PHS polymer in the resist will have the following general structural formula:

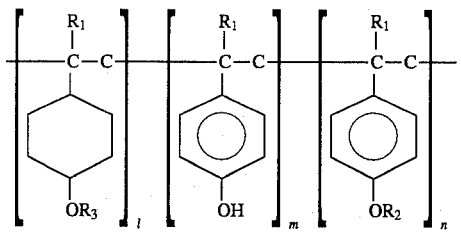

where $R_1$ is a hydrogen, halogen or a one to twelve carbon alkyl group, $R_2$ is an acid labile functional group, $R_3$ is hydrogen or an acid labile functional group, l is zero, one or greater than 1, and m an n are both greater than one. The cyclohexanol sub-unit arises from hydrogenation of the polymer, and will preferably constitute 0–20% of the polymer. Preferably, $R_1$ is a hydrogen or methyl group. In the practice of this invention, it is preferable to have the un-modified phenolic hydroxy moiety present in a greater proportion of the PHS polymer than the modified phenolic hydroxy site designated as $R_2$. For example, the subunits with the un-modified phenolic hydroxy moiety may generally comprise 50–99% of the polymer, while the subunits with the modified phenolic hydroxy site comprise 1–50% of the polymer. Good results have been achieved when the polymer has approximately 20–90% phenolic hydroxy and 10–80% —$OR_2$. Therefore, it should be understood that the percentage of subunits with a hydroxy moiety can constitute 1–99% of the polymer, and the percentage of subunits with an —$OR_2$ moiety can constitute 1–99% of the polymer. The modified PHS polymers within the practice of this invention will typically have a molecular weight ranging from 1500 to 50,000 daltons.

The $R_2$ acid labile functional group is removed by an acid generated during exposure of the photoresist to light energy such as occurs during electron beam (E-Beam), 365 nm UV light (I-line), and 248±20 nm deep ultraviolet light (deep-UV) patterning of the photoresist. Examples of suitable functional groups include those discussed in the patents which have been incorporated by reference, and particularly include methyl, isopropyl, benzyl, tert-butyl, methoxymethyl, isopropoxymethyl tetrahydropyranyl, tetrahydrofuranyl, trimethylsilyl, tert-butoxycarbonyl, isopropoxycarbonyl, and methoxypropanyl groups. Particularly good results have been achieved when the $R_2$ acid labile functional group is methoxypropyl such that the chemical structure of the modified PHS is as follows:

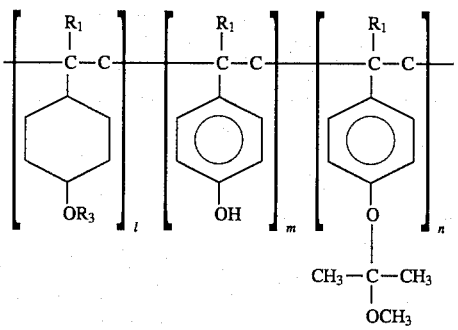

The modified PHS polymer will be present in a suitable solvent, such as those described in the patents which have been incorporated by reference. Glycol ether solvents such as 2-methoxyethyl ether (diglyme), ethylene glycol monomethyl ether, propylene glycol monomethyl ether, and propylene glycol mono ether acetate (PGMEA). Best results have been achieved with PGMEA, and it is expected that a high boiling point ether solvent will be the most suited for the formulation. However, it should be understood that other solvents used with PHS polymers such as aromatic hydrocarbons including toluene, xylene, and benzene, and ketones such as methylethyl ketone, and tetrahydrofuran, may be useful in the practice of this invention. The solvent will preferably comprise a majority of the photoresist composition (e.g., 50–99% by weight), with the remainder being comprised of the modified PHS polymer, the acid generating compound, the particular base additives of this invention, and other additives deemed desirable (e.g., stabilizers; dyes; adhesion promoters; solubility modifiers; other resins; and materials to improve chemical resistance, flexibility, etch resistance, electrical properties, coating characteristics, exposure speed, development and resolution characteristics, etc.). However, it should be understood that the amount of solvent can vary considerably (e.g., 1–99% by weight) within the practice of this invention. Good results have been achieved when the solvent comprises 60–90% by weight of the photoresist composition.

Modification of the PHS polymer may be performed in the solvent system by performing an acid catalyzed reaction with the pre-formed PHS polymer using a compound which includes the acid labile protecting group.

The acid generator compound, or "photoacid generator", used in the photoresist composition used in the practice of the present invention can be any of a variety of compounds that can generate an acid upon exposure to light energy, such as nitrobenzyl compounds, onium salts, sulfonic acid compounds, and carbonic acid compounds. Particularly good results can be achieved using triphenyl sulfonium salts such as triphenyl sulfonium triflate. Examples of photoacid generators are discussed at length in the patents incorporated by reference, and particularly in U.S. Pat. No. 5,258,257 to Sinta et al. The photoacid generator will be selected to respond to the light energy used for patterning the photoresist. Photoacid generators are currently available for a variety of different wavelengths from visible to X-ray; thus, imaging of the photoresist can be performed using deep UV, E-beam, laser, or any other activating radiation deemed useful. The photoacid generator will preferably comprise 0.01–20% by weight of the photoresist composition, and most preferably less than 10% by weight of the photoresist composition.

The base compounds of the present invention will be used in the photoresist composition at approximately 0.01–10% by weight, and will most preferably be approximately 5–50% by weight of the photoacid compound. For example, if the photoacid compound is 1.5% by weight of the photoresist composition, the base compounds of the present invention may constitute 0.075–0.6% by weight of the photoresist composition. The function of the base additive compounds is to scavenge protons generated in the photoresist composition, prior to the photoresist composition being patterned with light energy. If no base additives are present, residual acid in the formulation will attack and release the acid labile moieties on the modified PHS backbone during storage of the photoresist, thereby decreasing performance of the photoresist during processing and shelf-life of the resist. However, the base additive should be present in the photoresist compound at a significantly smaller concentration than the photoacid generator, since it would be undesirable to have all protons generated during imaging trapped by the base additive.

A particular advantage of each of the three base compounds of the present invention (berberine, cetyltrimethyl ammonium hydroxide, and proton sponge) is that they are easily handled on an industrial scale. This is because they each have melting points that are higher than room temperature. The bases can be added as a solid to the photoresist composition and dissolved or distributed evenly throughout the photoresist using the solvent and by agitation, stirring, or the like. In addition, in solid form, the bases are more easily stored, weighed, and added or transferred to the formulation mixture using conventional processing equipment.

Tetrabutyl ammonium hydroxide (TBAH) has been tried as a base additive stabilizer for chemically amplified photoresists. However, TBAH is provided by vendors as a liquid in a methanol solution. This solution is not readily applicable to industrial usage since it must be injected using a syringe into a photoresist mixture, and it suffers from evaporation problems (i.e., MeOH is a low boiling solvent) which will alter the base concentration and make reproducibility of base additions difficult.

Another important characteristic that needs to be considered in an additive base is that the additive should be sufficiently basic to trap acidic protons generated in the medium, but should not impact, react or otherwise interact with the formulated components over the period of its shelf life. Berberine, cetyltrimethyl ammonium hydroxide, and proton sponge bases are all relatively less nucleophilic.

Shelf-life studies have been conducted in formulations containing a modified PHS polymer having the chemical formula:

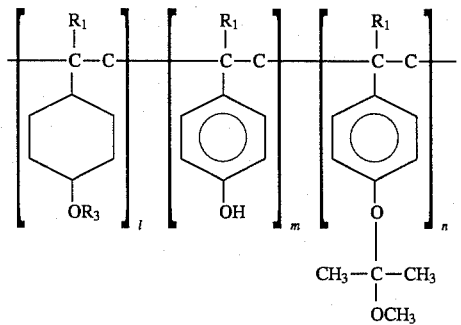

where l is zero, 1 or greater than 1, and m and n are both greater than 1, the average molecular weight ranges from 1,500 to 50,000 M.W., where $R_1$ was hydrogen, $R_3$ was hydrogen or the methoxy propyl moiety, and where the methoxy propanyl moiety was present at approximately 15–35% of the subunits in the polymer; PGMEA as the solvent; triphenyl sulfonium triflate as the photoacid initiator compound; and each of the three bases as the acid scavenger, as well as a study with TBAH as the acid scavenger for comparison purposes. In the studies, shelf-life is observed as a decrease in film thickness, wherein some of the methoxy propanyl moieties are deprotected by trace acid which is not scavenged by the base. Tables 1–5 present the results for the studies.

TABLE 1

0.7% TPS Tf + 0.22% Berberine adduct

| Time | 43° C. thickness(Å) | 0° C. thickness(Å) | difference |
|---|---|---|---|
| 100 hr | 10259 | 10396 | 137 |
| 200 hr | 10184 | 10405 | 221 |

TABLE 2

0.7% TPS Tf + 0.20% Cetyl trimethyl ammonium hydroxide

| Time | 43° C. thickness(Å) | 0° C. thickness(Å) | difference |
|---|---|---|---|
| 100 hr | 10221 | 10428 | 206 |
| 200 hr | 10221 | 10445 | 224 |

TABLE 3

1.5% TPS Tf + 0.14% proton sponge

| Time | 43° C. thickness(Å) | 0° C. thickness(Å) | difference |
|---|---|---|---|
| 100 hr | 9630 | 9751 | 121 |
| 200 hr | 9666 | 9775 | 109 |
| 300 hr | 9982 | 10157 | 175 |

TABLE 4

1.4% TPS Tf + 0.14% proton sponge

| 100 hr | 9040 | 9292 | 252 |
|---|---|---|---|

TABLE 5

1.4% TPS Tf + 0.14% TBAH/MeOH

| 100 hr | 9129 | 9361 | 232 |
|---|---|---|---|

The shelf-life studies demonstrated that the three preferred base compounds of the present invention provided for improved shelf-life for the chemically amplified photoresist composition. Exposure dose studies, which measured the amount of energy required to clear exposed film with one minute of developing, demonstrated that the exposure dose for photoresist compositions with these three bases remained the same before and after 100 hrs of storage.

A particular advantage of the proton sponge base is that it absorbs in the region of 280–380 nm with the absorption maximum at 334 nm when added to propyleneglycolmethyl ether acetate (PGMEA). This band is clearly separated from the modified PHS compound having the formula:

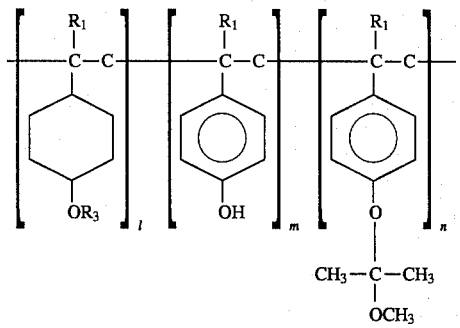

where l is zero, 1 or greater than 1, m and n are both greater than 1, $R_1$ is hydrogen, and $R_3$ is hydrogen or the hydrogen or methoxy propyl, which absorbs in the region below 300 nm with the absorption maximum at 278 nm. The absorption characteristic can be advantageous in the large scale manufacturing line, in that it can be used to accurately determine (assay) the concentration of the added base in the formulated resist solution. Protonation of the proton sponge shifts the absorption maximum to 287 nm.

It has also been found that berberine absorbs in the region of 220–470 nm with several bands. The absorption maximum of berberine occurs at 425 nm, which is clearly separated from the modified PHS compound of the present invention as discussed above. Thus, like proton sponge, the absorption characteristics of berberine will allow for accurate assaying of the concentration of the added base in the formulation in a large scale manufacturing line.

While the invention has been described in terms of a single preferred embodiment, those skilled in the art will recognize that the invention can be practiced with modification within the spirit and scope of the appended claims.

We claim:

1. A photoresist composition, comprising: 1–99% by weight of a polymer having the chemical formula:

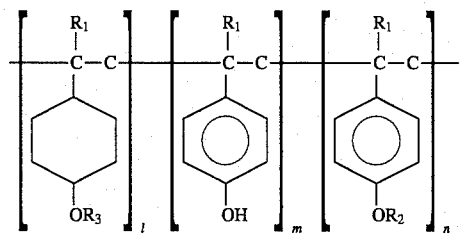

where $l$ is zero, 1 or greater than 1, and m and n are both greater than 1, where $R_1$ is selected from the group consisting of hydrogen and a $C_{1-12}$ alkyl group, where $R_2$ is an acid labile functional group; and where $R_3$ is a hydrogen or acid labile functional group;

1–99% by weight of a solvent for said polymer;

0.01–20% by weight of an acid generating compound; and 0.01–10% by weight of a base selected from the group consisting of berberine, and proton sponge.

2. The composition of claim 1 wherein said base is berberine.

3. The composition of claim 1 wherein said base is proton sponge.

4. The composition of claim 1, wherein said acid generating compound is selected from the group consisting of nitrobenzyl compounds, onium salts, and sulfonic acid generating compounds.

5. The composition of claim 4 wherein said acid generating compound is triphenylsulfonium triflate.

6. The composition of claim 1 wherein said solvent is selected from the group consisting of glycol ethers, aromatic hydrocarbons, tetrahydrofuran, and ketones.

7. The composition of claim 6 wherein said solvent is propylene glycol mono ether acetate.

8. The composition of claim 1 wherein said solvent is 50–99% by weight of said photoresist composition.

9. The composition of claim 1 wherein said acid generator compound is less than 10% by weight of said photoresist composition.

10. The composition of claim 1 wherein said base is present in said photoresist composition at approximately 5–50% by weight of said acid generator compound.

11. The composition of claim 1 wherein said polymer has the chemical formula:

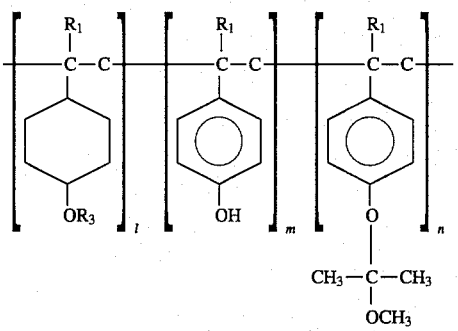

where $l$ is zero, 1, or greater than 1, and m and n are both greater than 1, where $R_1$ is selected from the group consisting of hydrogen and a $C_{1-12}$ alkyl group, and where $R_3$ is a hydrogen or a methoxy propyl moiety.

* * * * *